US012781338B2

(12) United States Patent
Ohtsuki et al.

(10) Patent No.: US 12,781,338 B2
(45) Date of Patent: Nov. 3, 2026

(54) METHOD FOR GROWING DIAMOND LAYER AND MICROWAVE PLASMA CVD APPARATUS

(71) Applicant: SHIN-ETSU HANDOTAI CO., LTD., Tokyo (JP)

(72) Inventors: Tsuyoshi Ohtsuki, Annaka (JP); Atsushi Suzuki, Nishigo-mura (JP); Toshiki Matsubara, Nishigo-mura (JP); Katsuyoshi Suzuki, Takasaki (JP); Tatsuo Abe, Shirakawa (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 0 days.

(21) Appl. No.: 18/876,870

(22) PCT Filed: May 8, 2023

(86) PCT No.: PCT/JP2023/017217
§ 371 (c)(1),
(2) Date: Dec. 19, 2024

(87) PCT Pub. No.: WO2023/248626
PCT Pub. Date: Dec. 28, 2023

(65) Prior Publication Data

US 2025/0369103 A1 Dec. 4, 2025

(30) Foreign Application Priority Data

Jun. 24, 2022 (JP) ................................ 2022-102056

(51) Int. Cl.
*C23C 16/27* (2006.01)
*C23C 16/458* (2006.01)
*C23C 16/46* (2006.01)

(52) U.S. Cl.
CPC .......... *C23C 16/274* (2013.01); *C23C 16/271* (2013.01); *C23C 16/458* (2013.01); *C23C 16/46* (2013.01)

(58) Field of Classification Search
CPC ... C23C 16/511; C23C 16/274; C23C 16/458; C23C 16/46; C23C 16/54; C23C 16/271
See application file for complete search history.

(56) References Cited

U.S. PATENT DOCUMENTS 5,364,423 A 11/1994 Bigelow et al.
5,387,288 A * 2/1995 Shatas ................ H01J 37/3222 118/712

(Continued)

FOREIGN PATENT DOCUMENTS

CN 111850506 A 10/2020
JP H05-017290 A 1/1993

(Continued)

OTHER PUBLICATIONS

International Search Report in application No. PCT/JP2023/017217 issued Jul. 11, 2023.

(Continued)

*Primary Examiner* — Michael P Wieczorek
(74) *Attorney, Agent, or Firm* — Harness, Dickey & Pierce, P.L.C.

(57) ABSTRACT

The present invention is a method for growing a diamond layer by a microwave plasma CVD method, including: a step of placing a substrate 2 in a reaction vessel 1 of a microwave plasma CVD apparatus 10; a step of introducing a raw material gas (reaction gas) 6 into the reaction vessel 1; and a step of growing a diamond layer on a surface of the substrate 2 by irradiating microwave plasma on the surface of the substrate 2, wherein the step of growing the diamond layer includes at least one of moving the substrate 2 in a direction parallel to the surface of the substrate 2 and (Continued)

moving an irradiation position of the microwave plasma in a direction parallel to the surface of the substrate 2. Thereby, a large-diameter diamond substrate is provided.

2 Claims, 4 Drawing Sheets

(56) References Cited

U.S. PATENT DOCUMENTS

| | | | |
|---|---|---|---|
| 5,643,365 A | 7/1997 | Blinov et al. | |
| 5,900,065 A * | 5/1999 | Liehr .................... | C23C 16/511 118/723 HC |
| 2009/0060408 A1 | 3/2009 | Nagasaka et al. | |

FOREIGN PATENT DOCUMENTS

| | | |
|---|---|---|
| JP | H05-132665 A | 5/1993 |
| JP | H05-239655 A | 9/1993 |
| JP | H08-134655 A | 5/1996 |
| JP | 2001354491 A | 12/2001 |
| JP | 2004176132 A | 6/2004 |
| JP | 2006143561 A | 6/2006 |

OTHER PUBLICATIONS

English translation of International Preliminary Report on Patentability in application No. PCT/JP2023/017217 issued on Jan. 2, 2025.

Japanese Notification of Reasons for Refusal in application No. 2024-528370 issued on Jan. 27, 2026.

Extended European Search Report in application No. 23826815.5 dated Jun. 18, 2026.

Taiwanese Office Action in application No. 112117066 dated Jul. 30, 2026.

* cited by examiner

[FIG. 1]
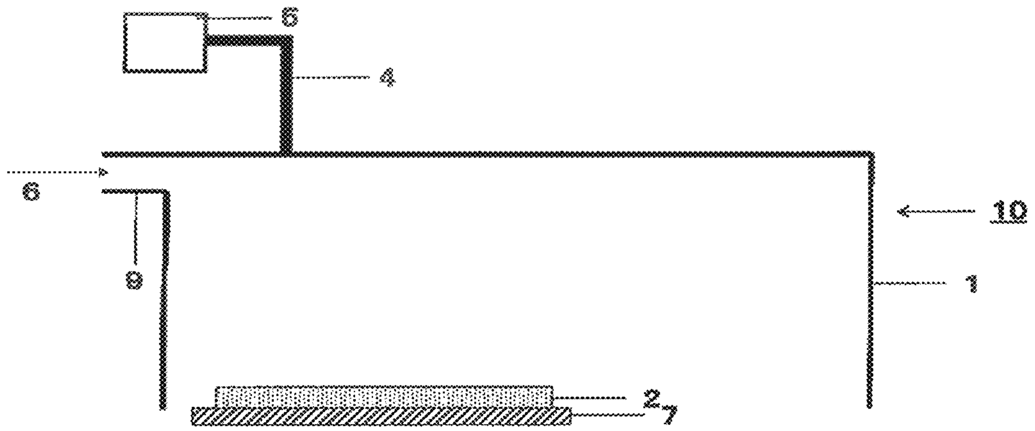
[FIG. 2]
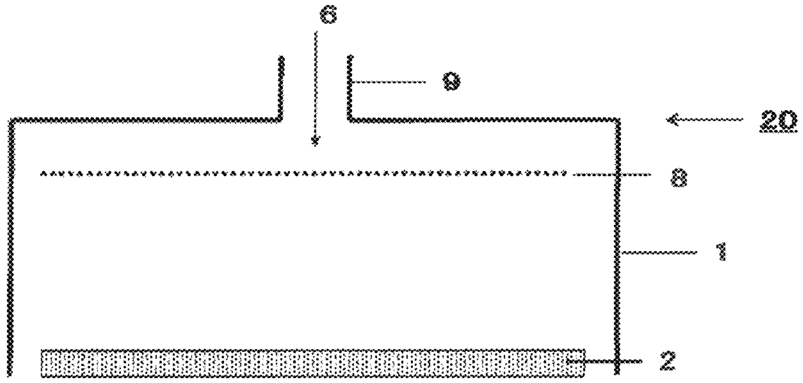

[FIG. 3A]
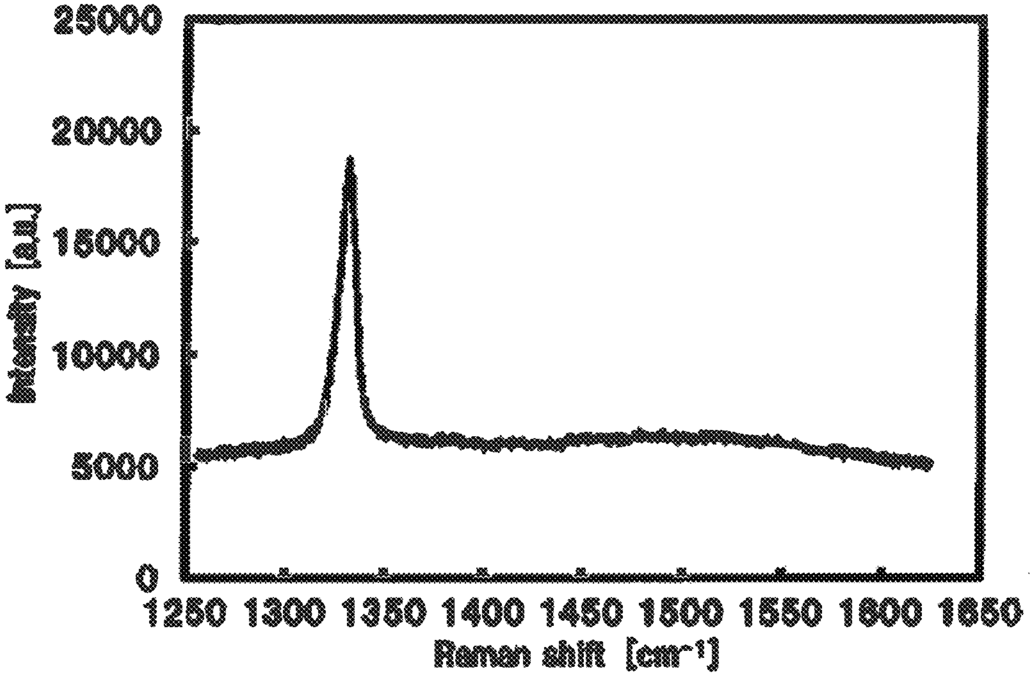
[FIG. 3B]
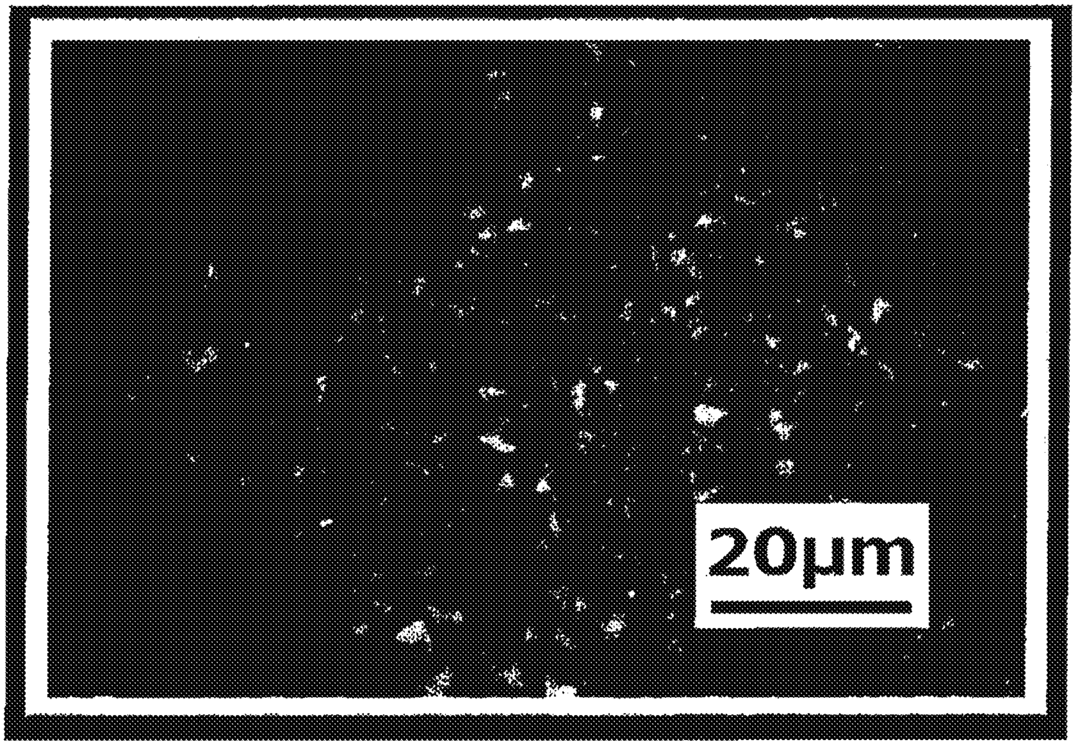

[FIG. 4A]
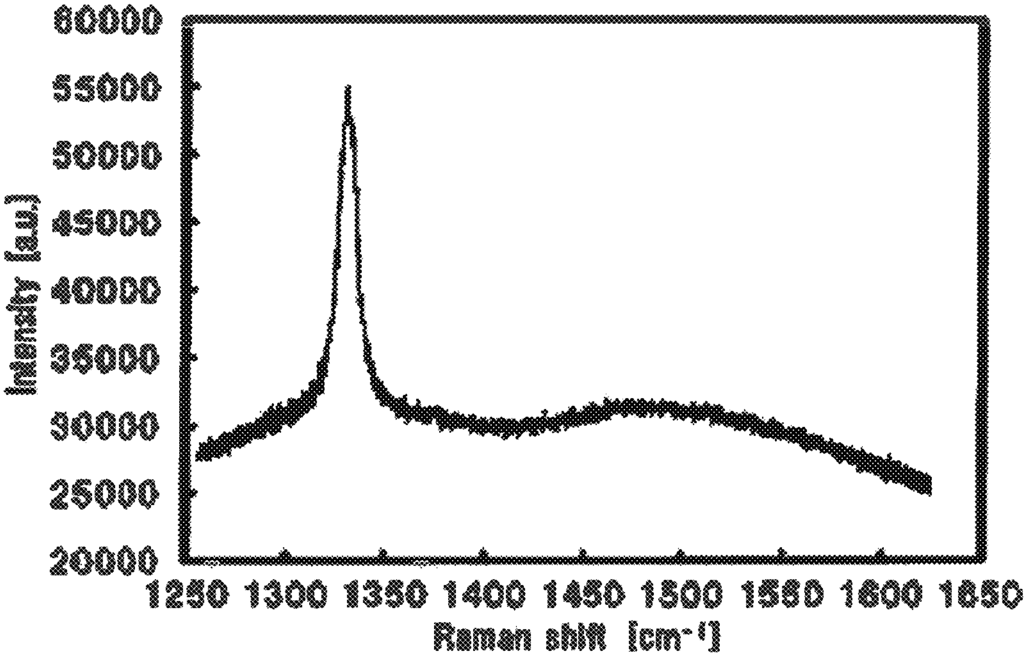
[FIG. 4B]
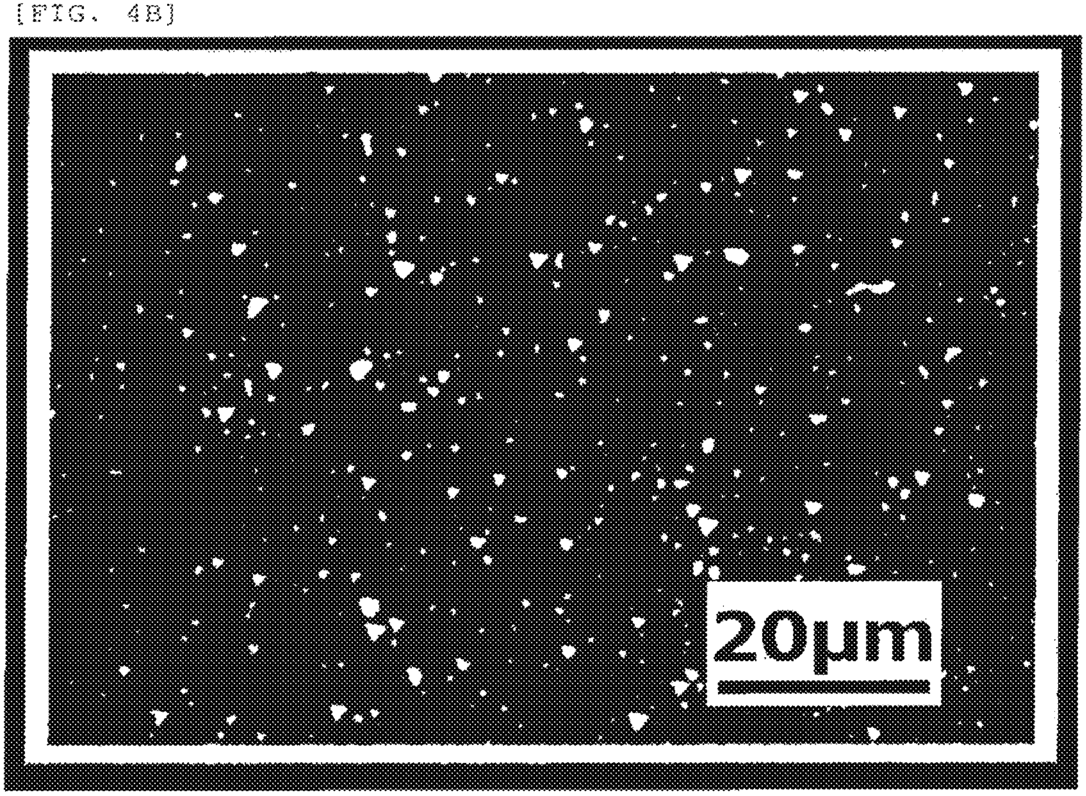

[FIG. 5] Prior Art
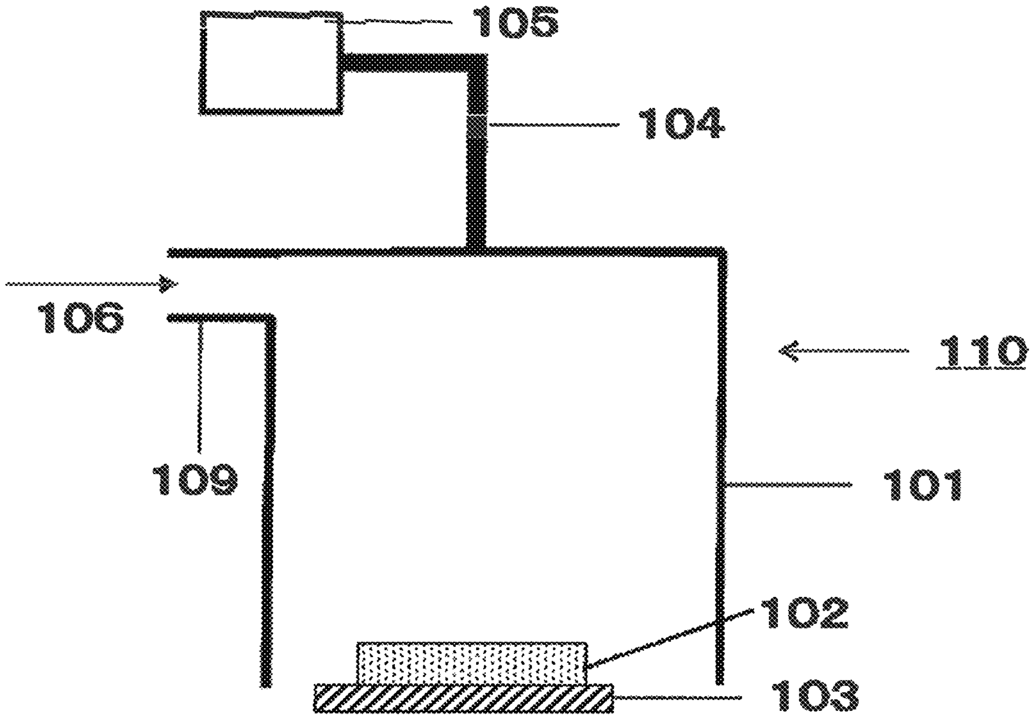

METHOD FOR GROWING DIAMOND LAYER AND MICROWAVE PLASMA CVD APPARATUS

CROSS-REFERENCE TO RELATED APPLICATIONS

This application is a U.S. National Phase Application under 35 U.S.C. 371 of International Application No. PCT/JP2023/017217, filed May 8, 2023, which claims priority to Japanese Application No. 2022-102056, filed Jun. 24, 2022. The entire disclosures of the above applications are incorporated herein by reference.

TECHNICAL FIELD

The present invention relates to a method for growing a diamond layer and a microwave plasma CVD apparatus. In particular, the present invention relates to technology regarding artificial diamond growth on a semiconductor substrate. More particularly, the present invention relates to a method for growing diamond and an apparatus thereof in growing diamond by CVD (chemical vapor deposition method) on a silicon substrate.

BACKGROUND ART

Diamond has been expected to be applied to various semiconductor devices and electronic devices because of having excellent physical property values such as high hardness, preferable thermal conductivity, high carrier mobility, and having a wide bandgap. Artificially synthesized diamond is used in the semiconductor device and electronic device applications. There are two methods for synthesizing diamond, that is, a growth method using ultrahigh pressure, and a vapor phase growth method. The vapor phase growth (CVD growth) has attracted attention in application to semiconductors, because a large diameter can be obtained (Patent Documents 1 to 3).

CITATION LIST

Patent Literature

Patent Document 1: JP 2001-354491 A
Patent Document 2: JP 2004-176132 A
Patent Document 3: JP 2006-143561 A

SUMMARY OF INVENTION

Technical Problem

The CVD growth is a method including placing a substrate inside a reaction tube, flowing a raw material gas (reaction gas) and carrier gas under normal pressure or reduced pressure, decomposing or activating the raw material gas (reaction gas) by thermal decomposition or plasma, and thereby causing growth on the substrate.

In diamond, microwave plasma, DC plasma, or a hot filament method using a filament such as tungsten is employed. In single crystal growth, the microwave plasma method has attracted attention. Microwave plasma growth is a method including irradiating microwave to a substrate, decomposing or activating a raw material gas (reaction gas), and thereby growing single crystal diamond.

FIG. 5 is a diagram illustrating a conventional microwave plasma CVD apparatus.

As shown in FIG. 5, a conventional microwave plasma CVD apparatus 110 has a reaction vessel 101, inside of which a silicon substrate (substrate to be film-formed) 102 can be placed. Inside of the reaction vessel 101 can be depressurized.

On the wall, a reaction gas introduction tube 109 is attached, and a reaction gas 106 can be introduced therein. The reaction gas 106 is, for example, a gas mixture of hydrogen gas and methane gas.

On the ceiling, a microwave introduction tube 104 connected to a microwave generator 105 (2.45 GHz) is attached. The microwave introduction tube 104 can irradiate microwave plasma toward the direct downward direction.

On the bottom surface side, a plate-shaped stage 103 (for heating substrate) is placed. The surface of the stage 103 is in parallel to the direction perpendicular to the above direct downward direction. Additionally, a silicon substrate 102 can be placed on the surface of the stage 103.

A silicon substrate 102 is placed on the surface of the stage 103.

As can be seen in FIG. 5, in principle, the area that can be irradiated by microwave is limited. Thus, the substrate diameter is limited.

A diamond substrate has attracted attention in view of the heat dissipation characteristics, or the like. Although the growth method applicable to single crystal substrates is microwave plasma growth, it has not been possible to achieve a large diameter such as 300 mm φ due to the limitation of the area that can be irradiated by microwave. Thus, formation of a large-diameter diamond substrate has been needed.

The present invention has been made to solve the problem described above, and has an object to provide a method for growing a diamond layer and a microwave plasma CVD apparatus that can achieve a large diameter.

Solution to Problem

The present invention has been made to achieve the above object, and provides a method for growing a diamond layer by a microwave plasma CVD method, including: a step of placing a substrate in a reaction vessel of a microwave plasma CVD apparatus; a step of introducing a raw material gas (reaction gas) into the reaction vessel; and a step of growing a diamond layer on a surface of the substrate by irradiating microwave plasma on the surface of the substrate, wherein the step of growing the diamond layer includes at least one of moving the substrate in a direction parallel to the surface of the substrate and moving an irradiation position of the microwave plasma in a direction parallel to the surface of the substrate.

According to the method for growing a diamond layer as described above, a large-diameter diamond layer can be formed. In more detail, in growing diamond on a large-diameter silicon substrate, the growth can be caused by placing a large-diameter silicon substrate on a stage of a microwave plasma growth apparatus, and introducing a raw material gas (reaction gas) while irradiating microwave to the substrate and moving the stage for each predetermined time. Thus, it is possible to grow a large-diameter single crystal diamond layer even with a microwave plasma CVD apparatus. Furthermore, by laterally growing the diamond layer in a part with high plasma density, and by promoting horizontal growth in a part with low plasma density, the method can also contribute to reduction of defects.

Note that it is defined that at least one of moving the substrate in a direction parallel to the surface of the substrate and moving an irradiation position of the microwave plasma in a direction parallel to the surface of the substrate is performed. Accordingly, the substrate may be moved after securing the plasma irradiation position, or on the contrary, the microwave plasma irradiation position (where microwave plasma density is high) may be moved in X and Y direction after securing the substrate, or both the substrate and irradiation position may be moved. By either method, it is possible to grow a large diameter single crystal diamond.

In this case, the method for growing a diamond layer described above can include that diamond is further grown on the diamond layer by a hot filament CVD method after transferring the substrate on which the diamond layer is grown into a reaction vessel of a hot filament CVD apparatus, after the step of growing the diamond layer.

Thereby, the thickness of the large-diameter diamond layer can be increased. By further growing the substrate grown by the microwave plasma CVD method using a hot filament CVD apparatus capable of causing large-diameter growth, further thick diamond can be grown on a large-diameter substrate. The diamond film grown by the microwave plasma CVD method may be used as it is. But for growing the diamond film thicker, more specifically, rather than the growth is caused by microwave plasma alone, the substrate grown by microwave plasma with the above method may be placed in a diamond growth apparatus using a hot filament method, methane and hydrogen may be introduced as gas into the reaction vessel, and the gas may be electrically heated and decomposed by energizing a filament such as tungsten provided above the substrate to grow diamond on the substrate. Thus, diamond can be grown on the entire large-diameter substrate.

In this case, the method for growing a diamond layer described above can include that a silicon substrate is used as the substrate.

Thereby, when an integrated circuit is formed on the silicon substrate on which a diamond layer has been formed, the diamond layer can be used as a heat sink layer.

Moreover, the present invention provides a microwave plasma CVD apparatus used for a method for growing a diamond layer, including at least one of a mechanism for moving a substrate in a direction parallel to a surface of the substrate and a mechanism for moving an irradiation position of microwave plasma.

By using the microwave plasma CVD apparatus described above, it is possible to form a large-diameter diamond layer. More particularly, if the apparatus has this mechanism, it is possible to grow large-diameter single crystal diamond even with the microwave plasma CVD apparatus.

In this case, the microwave plasma CVD apparatus described above can further include a mechanism for heating a substrate.

Thereby, growth of the large-diameter diamond layer can be promoted.

Advantageous Effects of Invention

As described above, according to the method for growing a diamond layer of the present invention, it is possible to form a large-diameter diamond layer by a microwave plasma CVD method. In particular, in the present invention, it is possible to grow a single crystal large-diameter diamond layer by a microwave plasma CVD method.

Also, according to the microwave plasma CVD apparatus of the present invention, it is possible to form a large-diameter diamond layer.

BRIEF DESCRIPTION OF DRAWINGS

FIG. 1 is a diagram illustrating a microwave plasma CVD apparatus of the present invention;

FIG. 2 is a diagram illustrating a hot filament CVD apparatus used for the method for growing a diamond layer of the present invention;

FIG. 3A is a graph showing Raman peak of a diamond film grown by the method for growing a diamond layer of the present invention (by a microwave plasma method alone);

FIG. 3B is an optical microscope image of a surface of a diamond film grown by the method for growing a diamond layer of the present invention (by a microwave plasma method alone);

FIG. 4A is a graph showing Raman peak of a diamond film grown by the method for growing a diamond layer of the present invention (by a microwave plasma method and hot filament method);

FIG. 4B is an optical microscope image of a surface of a diamond film grown by the method for growing a diamond layer of the present invention (by a microwave plasma method and hot filament method); and FIG. 5 is a diagram illustrating a conventional microwave plasma CVD apparatus.

DESCRIPTION OF EMBODIMENTS

Hereinafter, the present invention will be described in detail. However, the present invention is not limited thereto.

As described above, it has been required to provide a method for growing a diamond layer and a microwave plasma CVD apparatus that can form a large-diameter diamond layer, in particular a single crystal diamond layer, on a large-diameter silicon substrate.

The present inventors made intensive investigations on the above problem. As a result, they found that a large-diameter diamond layer, in particular a single crystal diamond layer can be formed on a large-diameter silicon substrate by a method for growing a diamond layer by a microwave plasma CVD method, including: a step of placing a substrate in a reaction vessel of a microwave plasma CVD apparatus; a step of introducing a raw material gas (reaction gas) into the reaction vessel; and a step of growing a diamond layer on a surface of the substrate by irradiating microwave plasma on the surface of the substrate, wherein the step of growing the diamond layer includes at least one of moving the substrate in a direction parallel to the surface of the substrate and moving an irradiation position of the microwave plasma in a direction parallel to the surface of the substrate. Thus, they completed the present invention.

Hereinafter, the method for growing a diamond layer and the microwave plasma CVD apparatus according to a first embodiment of the present invention will be described with referring to FIG. 1.

First Embodiment

Microwave Plasma CVD Apparatus

FIG. 1 is a diagram illustrating the microwave plasma CVD apparatus of the present invention.

As shown in FIG. 1, a microwave plasma CVD apparatus 10 of the present invention has a reaction vessel 1, inside of which a large-diameter silicon substrate 2 can be placed. The reaction vessel 1 is approximately circular in plan view. However, the shape of the reaction vessel 1 is not limited thereto, and may be approximately rectangular in plan view. Inside of the reaction vessel 1 can be depressurized.

Note that the left-right direction of the paper surface is X direction, and the direction perpendicular to the paper surface is Y direction.

On the wall, a reaction gas introduction tube 9 is attached, and a reaction gas 6 can be introduced therein. The reaction gas 6 is, for example, a gas mixture of hydrogen gas and methane gas.

On the ceiling, a microwave introduction tube 4 connected to a microwave generator 5 (2.45 GHz) is attached. The microwave introduction tube 4 can irradiate microwave plasma toward the direct downward direction.

On the bottom surface side, a plate-shaped stage 7 (for heating substrate, movable in X and Y direction) is placed. The surface of the stage 7 is in parallel to the direction perpendicular to the above direct downward direction. Additionally, the large-diameter silicon substrate 2 can be placed on the surface of the stage 7. Furthermore, the stage 7 includes a mechanism movable in the X and Y direction, and a mechanism capable of heating the large-diameter silicon substrate (substrate to be film-formed) 2 that is placed on the surface of the stage 7.

The large-diameter silicon substrate 2 is placed on the surface of the stage 7.

The large-diameter silicon substrate 2 is prepared by, for example, providing a boron-doped high-resistivity single crystal (111) silicon substrate with a 300 mm diameter, polishing the substrate surface with a #8000 grindstone (average particle size of abrasive grain: 2 to 4 μm), thereby roughening the silicon surface to introduce damage, and producing a nucleus for diamond growth.

Method for Growing Diamond Layer

Next, the method for growing a diamond layer is described.

The method for growing a diamond layer of the present invention is a method for growing a diamond layer, in particular a single crystal diamond layer, by a microwave plasma CVD method.

The method includes: a step of placing a substrate in a reaction vessel of a microwave plasma CVD apparatus (substrate placement step); a step of introducing a raw material gas (reaction gas) into the reaction vessel (raw material gas (reaction gas) introduction step); and a step of growing a diamond layer on the surface of the substrate by irradiating microwave plasma on the surface of the substrate (diamond layer growth step).

Substrate Placement Step

At first, as shown in FIG. 1, on the surface of the plate-shaped stage 7 placed on the bottom surface side of the reaction vessel 1 of the microwave plasma CVD apparatus 10, the large-diameter silicon substrate 2 is placed.

Raw Material Gas (Reaction Gas) Introduction Step

Next, the inside of the reaction vessel 1 is depressurized, and then the reaction gas 6 is introduced therein through the reaction gas introduction tube 9.

Diamond Layer Growth Step

Next, a diamond layer is grown on the surface of the large-diameter silicon substrate 2 by irradiating microwave plasma on the surface of the large-diameter silicon substrate 2.

The growing of the diamond layer includes at least one of moving the large-diameter silicon substrate 2 in a direction parallel to the surface of the large-diameter silicon substrate 2 and moving an irradiation position of the microwave plasma in a direction parallel to the surface of the substrate. Thereby, microwave plasma generated locally can be uniformly irradiated on the surface of the large-diameter silicon substrate, so that a large-diameter diamond layer can be uniformly formed on the surface of the large-diameter silicon substrate.

"Moving in a direction parallel to the surface of the substrate" includes rotary movement such as rotation and revolution as well as parallel movement of the substrate in the X-Y direction.

The moving speed is, for example, preferably about 1 to 50 mm/min when the substrate is moved in parallel to the X-Y direction, and in the case of rotary movement, it is preferably about 1 to 100 rpm.

In addition, when growing the diamond layer, it is preferable to heat the large-diameter silicon substrate 2. Thereby, the growth can be promoted.

Evaluation

Evaluation of the diamond layer is carried out by, for example, Raman measurement, optical microscope image observation of the surface, X-ray diffraction, or the like, in a plurality of parts of the large-diameter diamond layer surface. It is possible to determine the crystallinity of the large-diameter diamond layer or whether the layer surface is uniform.

Second Embodiment

At first, the hot filament CVD apparatus used in the method for growing a diamond layer in the second embodiment of the present invention is described with referring to FIG. 2.

Hot Filament CVD Apparatus

FIG. 2 is a diagram illustrating a hot filament CVD apparatus used for the method for growing a diamond layer of the present invention.

As shown in FIG. 2, a hot filament CVD apparatus 20 used for the method for growing a diamond layer of the present invention has the reaction vessel 1, inside of which the large-diameter silicon substrate 2 having a thin diamond layer formed on the surface, can be placed. Inside of the reaction vessel 1 can be depressurized.

On the ceiling, the reaction gas introduction tube 9 is attached, and the reaction gas 6 can be introduced therein. The reaction gas 6 is, for example, a gas mixture of hydrogen gas and methane gas.

A linear filament 8 is attached separated from the lower part of the ceiling directly below the reaction gas introduction tube 9 so as to be parallel to the lower surface of the ceiling.

Heating temperature of the filament 8 is, for example, 2200° C. For example, the filament 8 is made of, but not limited to, tungsten. The shape of the filament is not limited to linear, but may be a net shape.

Method for Growing Diamond Layer

Next, the method for growing a diamond layer according to the second embodiment is described.

The method for growing a diamond layer according to the second embodiment is a method for further growing a diamond layer on the diamond layer formed by the method for growing a diamond layer according to the first embodiment with a hot filament CVD apparatus.

That is, the method for growing a diamond layer according to the second embodiment includes a substrate placement step, a raw material gas (reaction gas) introduction step, and a step of growing a diamond layer in the method for growing a diamond layer according to the first embodiment, and additionally, a step of placing a substrate in a reaction vessel of a hot filament CVD apparatus (substrate placement step) and a step of further growing a diamond layer with the hot filament CVD apparatus (diamond layer additional growth step).

Substrate Placement Step

The large-diameter silicon substrate 2 on the surface of which a diamond layer, in particular a single crystal diamond layer, is formed thinly by the method for growing a diamond layer according to the first embodiment is placed in a reaction vessel of the hot filament CVD apparatus with the diamond layer facing toward the ceiling.

Diamond Layer Additional Growth Step

After depressurizing the inside of the reaction vessel 1, the filament 8 is heated to a predetermined temperature.

Thereafter, from the reaction gas introduction tube 9, the reaction gas 6 composed of a gas mixture of hydrogen gas and methane gas is introduced therein.

The linear filament 8 is attached separated from the lower part of the ceiling, directly below the reaction gas introduction tube 9 so as to be parallel to the lower surface of the ceiling. Thereby, the reaction gas 6 ejected from the reaction gas introduction tube 9 is heated by the filament 8, and collides with a thin diamond layer formed on the surface of the large-diameter silicon substrate 2. An additional diamond layer can be grown accordingly.

EXAMPLE

Hereinafter, the present invention will be specifically described with reference to Examples. However, the present invention is not limited thereto.

Example 1

A boron-doped high-resistivity single crystal (111) silicon substrate with a 300 mm diameter was provided. Then, the surface of the substrate was polished with a #8000 grindstone (average particle size of abrasive grain: 2 to 4 μm) to roughen the silicon surface for introducing damage, and thereby producing a nucleus for diamond growth.

This substrate was introduced into a microwave plasma growth apparatus, and 2.45 GHz microwave was irradiated under the following conditions: 1500 W, $H_2$ flow rate of 10 SLM, $CH_4$ concentration of 3%, substrate temperature of 850° C., and 60 Torr. Then, while moving the irradiation position at a speed of 10 mm/min, thereby causing the growth.

As a result, a large-diameter diamond layer could be formed.

Thereafter, Raman measurement and optical microscope image observation of the surface were performed in a plurality of parts of the large-diameter diamond layer surface.

FIGS. 3A and 3B show the results in an optional part. As shown in FIG. 3A, the growth of diamond was confirmed. In addition, as shown in FIG. 3B, high crystallinity was observed.

That is, in any parts, the Raman peak was confirmed, and the optical microscope image of the surface could be observed.

Example 2

The substrate of Example 1 (substrate on which diamond was grown) was placed in a hot filament apparatus and grown under the following conditions: filament temperature of 2200° C., $H_2$ flow rate of 10 SLM, $CH_4$ concentration of 3%, substrate temperature of 850° C., and 5 Torr for 4 hours.

As a result, the thickness of the large-diameter diamond layer could be increased.

Thereafter, Raman measurement and optical microscope image observation of the surface were performed in a plurality of parts of the large-diameter diamond layer surface.

FIGS. 4A and 4B show the results in an optional part. As shown in FIG. 4A, the growth of diamond was confirmed. In addition, as shown in FIG. 4B, high crystallinity was observed.

That is, in any parts, the Raman peak was confirmed, and the optical microscope image of the surface could be observed.

As described above, according to the Examples of the present invention, a large-diameter diamond layer with high crystallinity could be formed.

It should be noted that the present invention is not limited to the above-described embodiments. The embodiments are just examples, and any examples that substantially have the same feature and demonstrate the same functions and effects as those in the technical concept disclosed in claims of the present invention are included in the technical scope of the present invention.

The invention claimed is:

1. A method for growing a diamond layer by a microwave plasma CVD method, comprising:

a step of placing a substrate in a reaction vessel of a microwave plasma CVD apparatus;

a step of introducing a raw material gas (reaction gas) into the reaction vessel; and a step of growing a diamond layer on a surface of the substrate by irradiating microwave plasma on the surface of the substrate, wherein the step of growing the diamond layer comprises at least one of moving the substrate in a direction parallel to the surface of the substrate and moving an irradiation position of the microwave plasma in a direction parallel to the surface of the substrate, and wherein diamond is further grown on the diamond layer by a hot filament CVD method after transferring the substrate on which the diamond layer is grown into a reaction vessel of a hot filament CVD apparatus, after the step of growing the diamond layer.

2. A method for growing a diamond layer by a microwave plasma CVD method, comprising:

a step of placing a substrate in a reaction vessel of a microwave plasma CVD apparatus;

a step of introducing a raw material gas (reaction gas) into the reaction vessel; and a step of growing a diamond layer on a surface of the substrate by irradiating microwave plasma on the surface of the substrate, wherein the step of growing the diamond layer comprises at least one of moving the substrate in a direction parallel to the surface of the substrate and moving an irradiation position of the microwave plasma in a direction parallel to the surface of the substrate, wherein diamond is further grown on the diamond layer by a hot filament CVD method after transferring the substrate on which the diamond layer is grown into a reaction vessel of a hot filament CVD apparatus, after the step of growing the diamond layer, and wherein a silicon substrate is used as the substrate.

* * * * *